(12) United States Patent
York

(10) Patent No.: US 7,276,993 B2
(45) Date of Patent: Oct. 2, 2007

(54) ANALOG PHASE SHIFTER USING CASCADED VOLTAGE TUNABLE CAPACITOR

(75) Inventor: Robert A. York, Santa Barbara, CA (US)

(73) Assignee: Agile RF, Inc., Goleta, CA (US)

( * ) Notice: Subject to any disclaimer, the term of this patent is extended or adjusted under 35 U.S.C. 154(b) by 0 days.

(21) Appl. No.: 11/288,723

(22) Filed: Nov. 28, 2005

(65) Prior Publication Data

US 2006/0267709 A1 Nov. 30, 2006

Related U.S. Application Data

(60) Provisional application No. 60/690,452, filed on Jun. 13, 2005, provisional application No. 60/686,100, filed on May 31, 2005.

(51) Int. Cl.
*H03H 7/19* (2006.01)
(52) U.S. Cl. .................. 333/139; 333/164; 333/171
(58) Field of Classification Search ............... 333/139, 333/156, 164, 170, 171
See application file for complete search history.

(56) References Cited

U.S. PATENT DOCUMENTS 4,885,562 A * 12/1989 Ouvrard et al. ............. 333/139
4,945,321 A * 7/1990 Oppelt et al. ............... 333/119
6,674,321 B1 1/2004 York

OTHER PUBLICATIONS

Acikel, B. et al., "A New High Performance Phase Shifter Using $Ba_xSr_{1-x}TiO_3$ Thin Films," IEEE Microwave and Wireless Components Letters, Jul 2002, pp. 237-239, vol. 12, No. 7.
Hayashi, H. et al., "An MMIC Active Phase Shifter Using a Variable Resonant Circuit," IEEE Transactions on Microwave Theory and Techniques, Oct. 1999, pp. 2021-206, vol. 47, No. 10.
Hodges, N. et al., "A Precise Analog Phase Shifter for SHF SATCOM Phased Arrays," IEEE, GaAs IC Symposium, 1992, pp. 29-32.
Kim, D. et al., "2.4 GHz Continuously Variable Ferroelectric Phase Shifters Using All-Pass Networks," IEEE Microwave and Wireless Components Letter, Oct. 2003, pp. 434-436, vol. 13, No. 10.

(Continued)

*Primary Examiner*—Benny Lee
(74) *Attorney, Agent, or Firm*—Fenwick & West LLP

(57) ABSTRACT

A circuit topology is configured to flatten out a phase- and amplitude-response over a specified range of frequencies. The circuit topology also provides a large cumulative phase-shift. In one embodiment, the circuit topology cascades a plurality of all-pass sections, with the center-frequencies of each all-pass section staggered to create a substantially flat phase-response over a frequency range. Further, in one embodiment the plurality of all-pass sections has at least one all-pass section that is different from another all-pass section. Each all-pass section includes a tunable capacitor and has a center-frequency that can be varied by electronically tuning the capacitor. Each center frequency is selected to obtain substantially constant amplitude and phase response over a desired frequency range and capacitance tuning range.

58 Claims, 6 Drawing Sheets

OTHER PUBLICATIONS

Kim, D. et al, "S-Band Ferroelectric Phase Shifters with Continuous 180° and 360° Phase Shift Range," 4 pages.

Kim, D. et al., "Tunable $Ba_xSr_{1-x}TiO_3$ Interdigital Capacitors For Microwave Applications," 4 pages.

Liu, Y. et al., "$BaSrTiO_3$ Interdigitated Capacitors for Distributed Phase Shifter Applications," IEEE Microwave and Guided Wave Letters, Nov. 2000, pp. 448-450, vol. 10, No. 11.

Nath, J. et al., "Microwave Properties of BST Thin Film Interdigital Capacitors on Low Cost Alumina Substrates," 34th European Microwave Conference, Amsterdam, 2004, pp. 1497-1500.

Viveiros, D. et al., "A Tunable All-Pass MMIC Active Phase Shifter," IEEE Transactions on Microwave Theory and Techniques, Aug. 2002, pp. 1885-1889, vol. 50, No. 8.

Yoon, Y.K. et al., "A Reduced Intermodulation Distortion Tunable Ferroelectric Capacitor: Architecture and Demonstration," IEEE Transactions on Microwave Theory and Techniques, Dec. 2003, pp. 2568-2576, vol. 51, No. 12.

York, R.A. et al., "Thin-Film Phase Shifters for Low-Cost Phased Arrays," URSI Conference, 2000, 10 pages.

PCT International Search Report and Written Opinion, PCT/US06/21149, Jan. 3, 2007, 9 pages.

\* cited by examiner

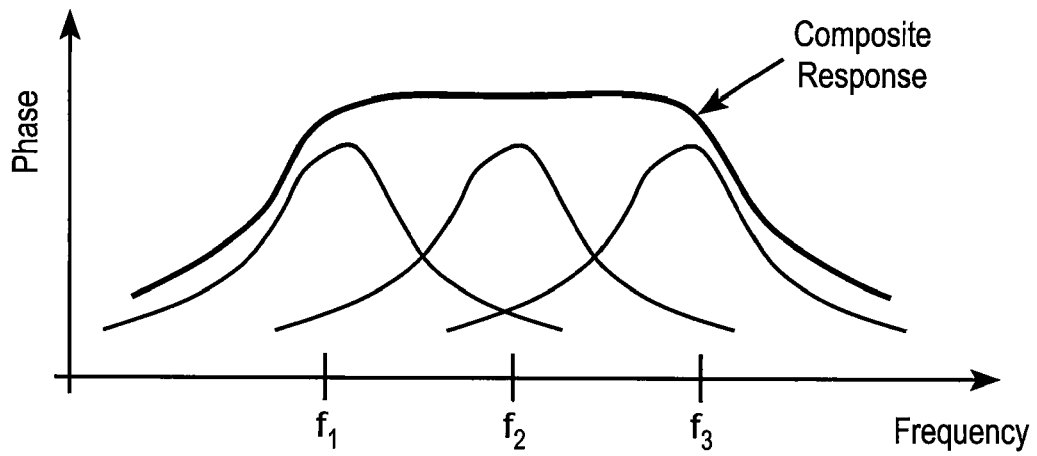
FIG. 5
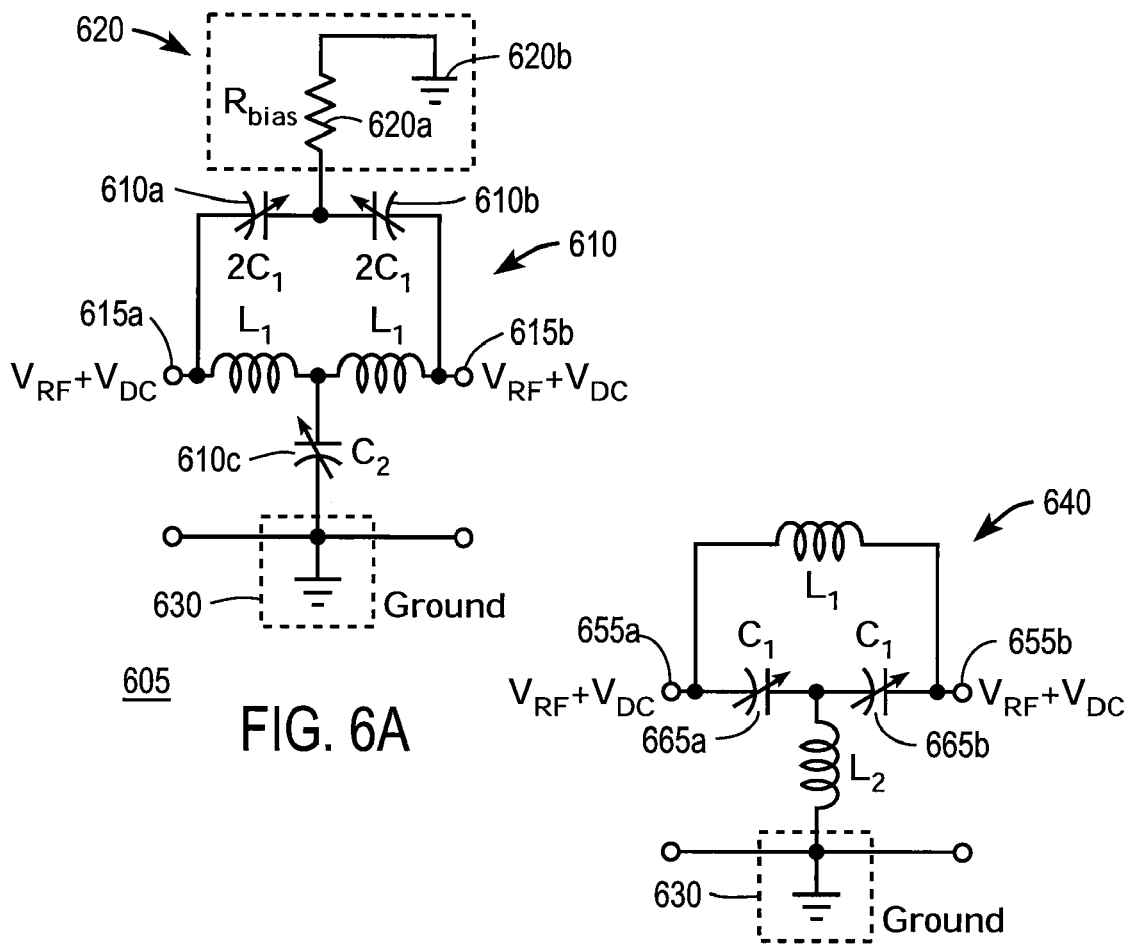
FIG. 6A
FIG. 6B

ANALOG PHASE SHIFTER USING CASCADED VOLTAGE TUNABLE CAPACITOR

CROSS REFERENCE TO RELATED APPLICATIONS

This application claims a benefit of, and priority under 35 USC § 119(e) to, U.S. Provisional Patent Application No. 60/690,452, filed Jun. 13, 2005, titled "Analog Phase Shifters Using Voltage-Tunable Capacitors", and U.S. Provisional Application No. 60/686,100, filed May 31, 2005, titled "Broadband and Compact Analog Phase-Shifters Using Voltage-Tunable Capacitors," the contents of both applications which are herein incorporated by reference.

BACKGROUND OF THE INVENTION

1. Field of the Invention

The present invention generally relates to the field of analog phase shifters and more specifically, to analog phase shifters using voltage variable capacitors.

2. Description of the Related Art

All-pass networks are used in communication electronics for phase-compensation and phase-shifting networks. The transfer $H(\omega)$ for a simple fourth-order all-pass network has the form $$H(\omega) = \frac{\omega^2 + aj\omega - b^2}{\omega^2 - aj\omega - b^2} \quad (1)$$

where $\omega$ is frequency, and a and b are constants.

Consequently, the amplitude response is a constant and only the signal phase is affected. Fourth-order lumped-element all-pass networks can be constructed from "bridged-tee" circuits. FIGS. 1a and 1b illustrate conventional bridged-tee circuits and design equations for realizing all-pass transfer functions. Specifically, FIG. 1a illustrates a conventional bridged low-pass tee and FIG. 1b illustrates a conventional bridged high pass tee. The symbols labeled $C_1$ and $C_2$ are capacitive elements with capacitance of $C_1$ and $C_2$ respectively. Similarly, the symbols labeled $L_1$ and $L_2$ are inductive elements with inductance of $L_1$ and $L_2$ respectively.

The relevant design equations are also given with these figures, where R is the desired input/output impedance of the circuit, $\omega_0$ is the center frequency for the bridged-tee circuit, and the capacitances $C_1$ and $C_2$ and inductances $L_1$ and $L_2$ are defined as shown in the FIGS. Note that $$C_2 = 4C_1 \quad (2)$$

and $$R = \sqrt{\frac{2L_1}{C_2}}$$

where $C_1$, $C_2$ and $L_1$ are the capacitances and inductance shown in FIG. 1a.

Two related conventional all-pass sections are shown in FIGS. 2a and 2b. These sections include a shunt resonator element to achieve a more rapid variation in phase near the center frequency, specified by the Q-factor in the design equations. As with FIGS. 1a and 1b, the symbols labeled $C_1$ and $C_2$ are capacitive elements with capacitance of $C_1$ and $C_2$ respectively, and the symbols labeled $L_1$ and $L_2$ are inductive elements with inductance of $L_1$ and $L_2$ respectively. In the design equations shown, the terms have the same definitions as in FIGS. 1a and 1b. and the new term Q is the Q-factor. In FIGS. 2a and 2b, the conventional all-pass networks are illustrated with $Q \geq 1$. These circuits reduce to that of FIGS. 1a and 1b when Q=1.

The phase response of a conventional phase shifter circuit using bridged-tee networks can be varied electronically by making the capacitive elements voltage-tunable, as indicated by the arrow through the capacitor symbols. The symbols labeled $C_1$ and $C_2$ are voltage-tunable capacitive elements with capacitance of $C_1$ and $C_2$ respectively, and the symbols labeled $L_1$ and $L_2$ are inductive elements with inductance of $L_1$ and $L_2$ respectively. FIG. 3a illustrates a conventional bridged low-pass tee with a voltage tunable capacitive element and FIG. 3b illustrates a conventional bridged high pass tee with a voltage tunable capacitive element.

FIG. 4 illustrates a response of a single, ideal all-pass section with R=1 and $\omega_0=1$ and Q=1 as the capacitors are varied by a factor of two around the nominal design values specified in FIGS. 1a and 1b. Note that the maximum phase-shift occurs at the "center-frequency" of the design. Thus by properly choosing the inductor and capacitor values, the circuit can be designed for a prescribed center-frequency and characteristic impedance. Usually (but not always) the characteristic impedance is set at 50 Ohms for an RF circuit.

Phase-shifters based on lumped-element all-pass sections such as those in FIGS. 2a and 2b have been demonstrated with several different technologies for tunable capacitors. The article "A precise analog phase-shifter for SHF SATCOM phased arrays (N. E. Hodges and M. H. Yam, 1992 IEEE GaAs IC Symposium Digest, pp. 29-32) describes a phase-shifter using diode varactors. The article "A MMIC active phase shifter using variable resonant circuit" (A. Hayashi and M. Muraguchi, IEEE Transactions Microwave Theory Tech., vol. 47, Oct. 1999, pp. 202 1-2026) and the article "A tunable all-pass MIC active phase shifter (D. Viveiros, D. Consonni, and A. K. Jastryebski, IEEE Transactions Microwave Theory Tech., vol. 50, August 2002, pp. 1885-1889) describes an all-pass phase-shifter using GaAs MESFETs. The article "2.4 GHz Continuously Variable Ferroelectric Phase Shifters Using All-Pass Networks" (D. Kim et al., IEEE Microwave and Wireless Components Left, vol. 13, Oct. 2003, pp. 434-436) describes an all-pass phase-shifter using capacitors made from tunable dielectric materials. However, electronic phase-shifters using all-pass section are not common, and at least one prominent textbook in this field fails to mention the topology (see, S. Koul and B. Bhat, Microwave and Millimeter-wave Phase Shifters, vol. II: Semiconductor and Delay-Line Phase Shifters, Artech House: Boston, Mass., 1991.

One reason for the lack of interest in all-pass phase-shifter is that in many applications such as phased-array antennas, a voltage-variable phase-shift of up to 360 degrees is desirable. This is not practical with a single all-pass section, because extremely large capacitance tuning ratios are required, and the resulting changes in the characteristic impedance of the circuit result in severe impedance mismatches with the host system and consequently poor insertion-loss characteristics. In particular, a conventional single-all pass section provides a phase-shift of barely up to 90 degrees.

One attempt at solving this problem has been described in the Hodges and Yam article and the Kim et al. article previously referenced, where two identical all-pass sections have been cascaded to increase the phase-shift. However, this approach suffers from several drawbacks. First, the phase-versus-frequency response is not constant, as is desired in many applications. Second, the variation in characteristic impedance as the capacitors are tuned has an increasingly pronounced effect as the number of sections increases. This is severely exacerbated by non-idealities in the lumped elements, such as interwinding capacitance in the inductive elements, mutual inductive coupling between the inductive elements, or parasitic inductance in the interconnecting lines between adjacent all-pass sections.

From the above, there is a need for a phase shifter that provides phase shift over almost 360 degrees (or greater) and is relatively constant over a wider frequency range with a limited amplitude modulation over the range.

SUMMARY OF THE INVENTION(S)

To address the shortcomings in the related arts, a circuit topology is configured to flatten out a phase- and amplitude-response over a specified range of frequencies. The circuit topology also provides a large cumulative phase-shift.

In one embodiment, the circuit topology of a plurality of all-pass sections (or circuits) forms a cascaded configuration when coupled together. Each all-pass section has a center-frequency. The frequencies are staggered to create a substantially flat phase-response over a predetermined frequency range. Further, in one embodiment the plurality of all-pass sections has at least one all-pass section that is different from another all-pass section. Each all-pass section includes a tunable capacitor and a center-frequency. Each center frequency is selected to obtain substantially constant amplitude and phase response over a desired frequency range and capacitance tuning range.

The circuit topology beneficially provides compact and broadband phase-shifters for phased-arrays using tunable capacitors. In one embodiment, the circuit topology provides a phase-shift to an RF signal over a desired range of frequencies. An advantage of the circuit topology is a flat phase versus frequency response over a wide range of frequencies. Further, the circuit topology also includes an advantage of little amplitude modulation over the frequency range and the bias states of the device. Moreover, the circuit topology can be configured as a device having a suitably small size.

The circuit topology overcomes many previous limitations of conventional varactor-based phase-shifters, particularly those requiring large phase-shifts in excess of 360-degrees. A conventional phase shifter with a single all-pass circuit does not provide greater than a 90-degree phase shift so such a device is inconsequential for configurations requiring a large phase-shift. Large phase-shifts are useful in certain applications, for example, phase-array antennas where theoretically 360-degree phase shifts are needed. However, due to conventional manufacturing and mechanical tolerances and errors in some instances more than a 360-degree phase shift is required, for example, a phase shift of up to 400-degrees.

In addition, the circuit topology may include a DC biasing circuit. Generally, a composite phase-shifter has numerous tunable capacitors so that direct current (DC) control biasing becomes complicated if control wires are run to each tunable capacitor. Thus, in one embodiment, capacitors and inductors are preferably connected so that all sections can be biased from a single DC control line that is resistively coupled to the input or output. This configuration beneficially reduces complexity and may provide other benefits such as reduced circuit layout size, which would allow for smaller device sizes.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 5 illustrates one embodiment of a response of an all-pass section with R=1 and $\omega_0$=1 and Q=1 as the capacitors are varied, e.g., by a factor of two around the nominal design values illustrated in FIG. 2.

FIG. 6a illustrates one embodiment of a bridged low-pass with DC biasing circuit.

FIG. 6b illustrates one embodiment of a bridged-high pass with a DC biasing circuit.

DETAILED DESCRIPTION OF THE PREFERRED EMBODIMENTS

Figure 1A:
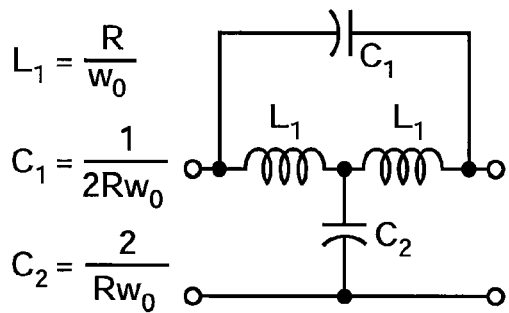
FIGS. 1a and 1b (prior art) illustrate conventional bridged-tee circuits and design equations for realizing all-pass transfer functions.
Figure 1B:
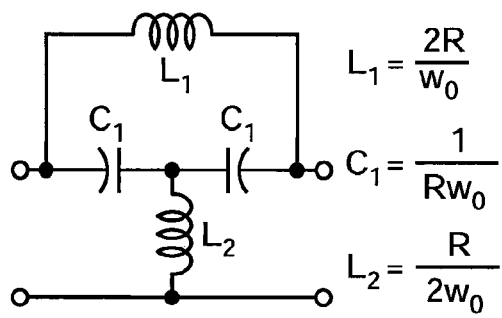
Figure 2A:
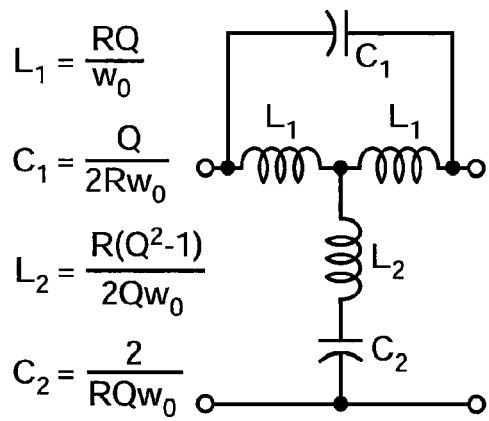
FIGS. 2a and 2b (prior art) illustrate conventional all-pass sections.
Figure 2B:
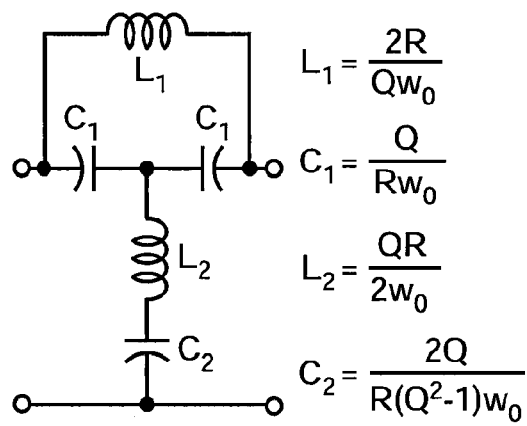

The Figures ("FIGS.") and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles described herein.

The disclosed embodiments include a circuit topology that flattens out a phase- and amplitude-response over a specified range of frequencies, and provides a large cumulative phase-shift. In one embodiments a circuit topology is configured to cascade three or more all-pass sections (circuits), with the center-frequencies of the all-pass sections staggered in such a way as to create a flat phase-response over a frequency range.

FIG. 5 illustrates one example of a phase response of an all-pass section with R=1 and $\omega_0$=1 and Q=1 as the capacitors are varied, e.g., by a factor of two around the nominal design values associated with circuit designs such as those illustrated in FIGS. 6a and 6b. In one embodiment, a circuit topology (configuration) to achieve the benefits drawn out in FIG. 5 (e.g., constant or substantially constant phase response and/or amplitude) can be attained through a set of all-pass sections as further described herein, for example, with reference to FIGS. 7 and 8. It is noted that the actual number of sections that are needed is determined by the required total phase-shift and the bandwidth.

The circuit topologies as described herein provide compact and broadband phase-shifters for phased-arrays using tunable capacitors. The device provides a phase-shift to radio-frequency (RF) signal over a desired range of frequencies. One advantage of such a circuit topology is a flat phase versus frequency response over a wide range of frequencies, as well as little amplitude modulation over this frequency range and the bias states of the device. Moreover, the circuit topology can be packaged as a device having a small size. This overcomes many previous limitations of varactor-based phase-shifters, particularly for those requiring large phase-shifts in excess of 360 degrees.

A composite phase-shifter typically includes numerous tunable capacitors so that DC control biasing can become complicated if control wires are run to each capacitor. FIG. 6a illustrates one embodiment of a bridged low-pass with DC biasing circuit 605 which reduces such conventional complexity. The bridged low-pass with DC biasing circuit 605 has a topology that includes a modified bridge low-pass circuit 610, a shunt bias 620 and a ground 630. The shunt bias 620 includes a shunt resistance $R_{bias}$ 620a coupled to a shunt ground 620b.

Figure 3A:
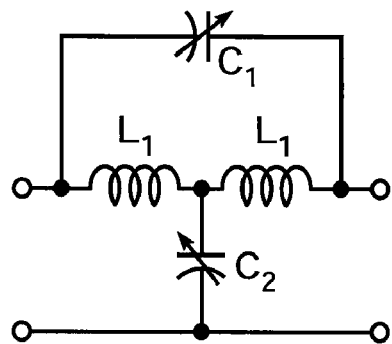
FIG. 3a (prior art) illustrates a conventional bridged low-pass tee with a voltage tunable capacitive element.

The modified bridge low-pass circuit 610 is derived from a conventional bridge low-pass circuit configuration, e.g., as shown in FIG. 3a, by splitting a varactor (or tunable capacitor) $C_1$ into a series combination, $2C_1$ 610a, $2C_1$ 610b, and adding the shunt bias 620. The modified bridge low-pass circuit 610 couples a DC bias voltage signal (e.g., $V_{RF}$+$V_{DC}$) an input 615a and/or an output 615b that is then delivered to the varactors $2C_1$ 610a, $2C_1$ 610b, $C_2$ 610c. It is noted that when symmetry is sought with respect to application of the DC bias voltage to the circuit 605, the DC bias voltage can be applied simultaneously to both terminals rather than to one terminal 615a or the other 615b. The symbol labeled $L_1$ is an inductive element, as in FIG. 3a.

Figure 3B:
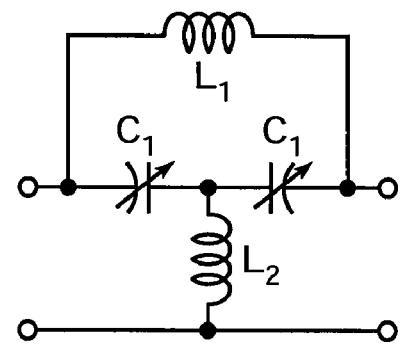
FIG. 3b (prior art) illustrates a conventional bridged high pass tee with a voltage tunable capacitive element.
Figure 4:
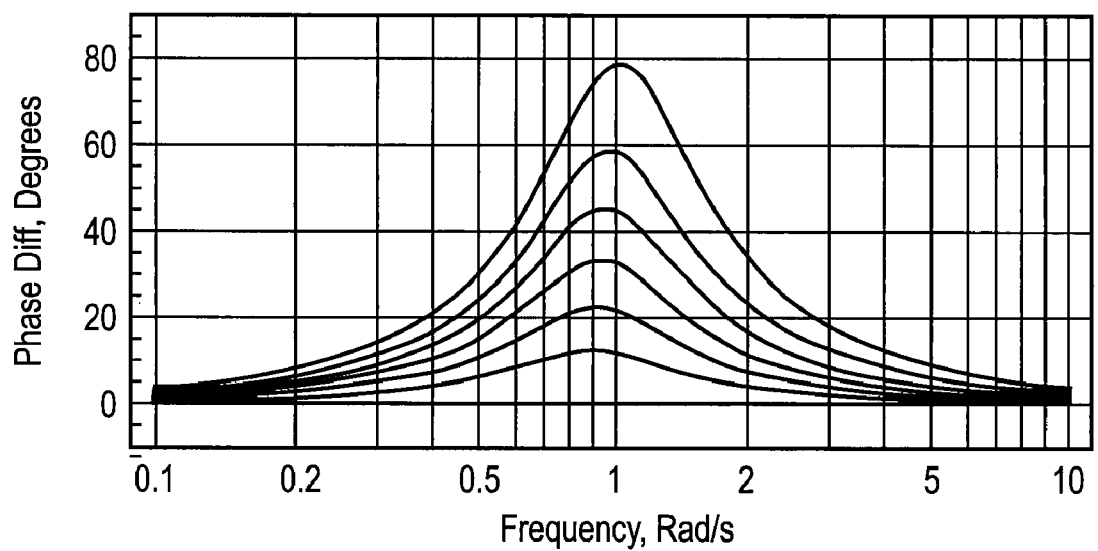
FIG. 4 (prior art) illustrates a conventional response of a single, ideal all-pass section with R=1 and $\omega_0$=1 and Q=1 as the capacitors are varied by a factor of two around the nominal design values specified in FIGS. 1a and 1b.

FIG. 6b illustrates one embodiment of a bridged-high pass with direct current (DC) biasing circuit 645. The bridged-high pass with DC biasing circuit 645 includes a bridged high-pass circuit 640 with an input 655a and an output 655b. In contrast to the bridged low-pass with DC biasing circuit 605 configuration, the bridged-high pass with DC biasing circuit 645 is less complex with respect to biasing. In particular, the DC bias voltage signal (e.g., $V_{RF}$+$V_{DC}$) at the input 655a and/or output 655b is applied across each varactor C1 665a, C1 665b by virtue of the inductor elements, which behave as short circuits with respect to DC signals. Again, it is noted that when symmetry is sought with respect to application of the DC bias voltage signal to the circuit 645, the DC bias voltage can be applied simultaneously to both terminals rather than to one terminal 655a or the other 655b. The symbol labeled $L_2$ is an inductive element, as in FIG. 3b. Element 630 is ground, as in FIG. 6a.

Thus, in configurations of the bridged low-pass with DC biasing circuit 605 or the bridged high-pass with DC biasing circuit 645, the varactors and inductors preferably are connected so that the circuit section can be biased from a single DC control line. In the bridged low-pass with DC biasing circuit 605, the DC biasing is resistively coupled to the input 615a, 655a or output 615b, 655b, while no additional resistance coupling is necessary for the high-pass with DC biasing circuit 645. In alternative embodiments, DC biasing circuits such as those described in U.S. Pat. No. 6,674,321, which is assigned to the same assignee as the present invention and the contents of which is hereby incorporated by reference, also can be used in the configurations disclosed.

Figure 7A:
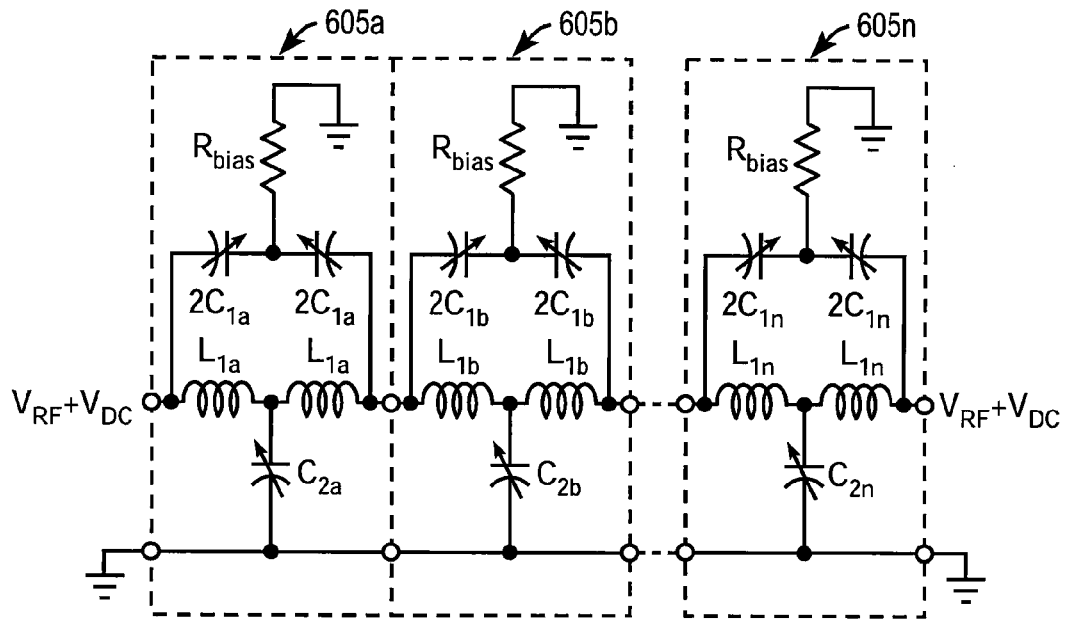
FIG. 7a illustrates one embodiment of a cascade of bridged low-pass with DC biasing circuit sections.

The configurations for each bridged circuit 605, 645 described above can be used to create a topology that comprises two or more circuits 605, 645 of the same type assembled in a cascaded configuration. For example, FIG. 7a illustrates one embodiment of a cascaded circuit 705 comprised of more than two bridged low-pass with DC biasing circuit 605 a-n (generally 605) sections, where n references a last section. In each section, a suffix a-n may be added to a circuit element to indicate the relevant section. For example, section 605a in FIG. 7a has the same circuit topology as circuit 605 of FIG. 6a. However, the varactors labeled $2C_1$ in FIG. 6a are labeled as $2C_{1a}$ in section 605a of FIG. 7a, the varactor labeled $C_2$ in FIG. 6a is labeled as $C_{2a}$ in section 605a of FIG. 7a, and the inductors labeled $L_1$ in FIG. 6a are labeled as $L_{1a}$ in section 605a of FIG. 7a. Similar labeling is correspondingly used for sections 605b-n.

In the illustrated configuration, each section of the cascaded circuit 705 generates a frequency-phase response curve with a center frequency as illustrated in FIG. 5. For example, the first section 605a generates a frequency-phase response curve with a center frequency of $f_1$ in FIG. 5. The second section 605b generates a frequency-phase response curve with a center frequency of $f_2$. The third section 605c (not shown) generates a frequency-phase response curve with a center frequency of $f_3$. In general, the nth section 605n generates a frequency-phase response curve with a center frequency of f$n$, where n=1,2,3, etc. The cumulative frequency-phase response curves result in a composite frequency-phase response curve that provides a relatively flat phase over a variety of frequencies.

It is noted that as the DC biasing voltage (e.g., $V_{RF}$+$V_{DC}$) across the varactors ($2C_{1a}$) in the cascaded circuit 705 changes, the curve amplitude changes up or down. In turn, these changes correspond to a change in phase. Further, in the configuration illustrated in FIG. 7a, at least some of the all-pass sections have different center frequencies. In the example shown, if the center frequencies are $f_1$, $f_2$ and $f_3$, and there are two all pass sections for each center frequency, there are many different combinations for the order of each all pass section (e.g., 605a, 605b, 605c (not shown)). In one embodiment, orders that "mix up" the different center frequencies (e.g., $f_1$, $f_2$, $f_3$, $f_1$, $f_2$, $f_3$, where the first all-pass section 605a has a center frequency $f_1$, the second all-pass section 605b has a center frequency $f_2$, etc.) are generally preferred over those that do not (e.g., $f_1$, $f_1$, $f_2$, $f_2$, $f_3$, $f_3$, where the first all-pass section 605a has a center frequency $f_1$, the second all-pass section 605b has a center frequency $f_1$, etc.). The staggering of center frequencies helps ensure sufficient peak values that allow for a composite frequency-phase response curve that is relatively flat over a particular frequency range.

As an illustrative example of the flexibility of the configuration disclosed, if a relatively flat phase is desired from 18 GHz to 22 GHz, the first section 605a of the cascaded circuit 705 could have a center frequency $f_1$ of just under 18 GHz while the nth section 605n of the cascaded circuit 705 could have a center frequency $f_n$ of just over 22 GHz. As another illustrative example, a wider range for a flat phase the first section 605a could have a center frequency $f_1$ of just under 17 GHz, the nth section 605n could have a center frequency $f_n$ of just over 23 GHz and another section 605x (not shown) may have a center frequency $f_x$ that is a geometric mean of 17 GHz and 23 GHz so that a relatively flat phase can be ensured from 18 GHz to 22 GHz. Thus, the claimed invention provides a relatively flat phase over predetermined wide (or narrow) frequency range.

The configuration described with respect to FIG. 7a illustrates an example of a cascaded topology using modified bridged low-pass section 605. The principle disclosed and describe with respect to that configuration are also applicable to a modified bridged high-pass section 645. In these configurations, the same type of all-pass sections are used n the cascaded topology with schemes for staggering the center frequencies, for example, $f_1$-$f_2$-$f_1$-$f_2$-$f_1$-$f_2$ (i.e., first all-pass section has center frequency $f_1$, second all-pass section has center frequency $f_2$, etc.) or $f_1$-$f_1$-$f_2$-$f_2$-$f_1$-$f_1$ (i.e., first all-pass section has center frequency $f_1$, second all-pass section has center frequency $f_1$, etc.), etc.

In alternative embodiments, the cascaded topology can be configured to have a configuration that includes alternating types of all-pass sections, e.g., the modified bridged low-pass section 605 is followed by a different all-pass section, e.g., the modified bridged high-pass section 645, before repeating. The alternating type of all-pass section, along with their respective center frequencies, provides an advantage of amplitude flatness. The characteristic impedance of the two types of sections vary in opposite ways as the varactors are tuned so that the impedance mismatches average out to some extent.

Figure 7B:
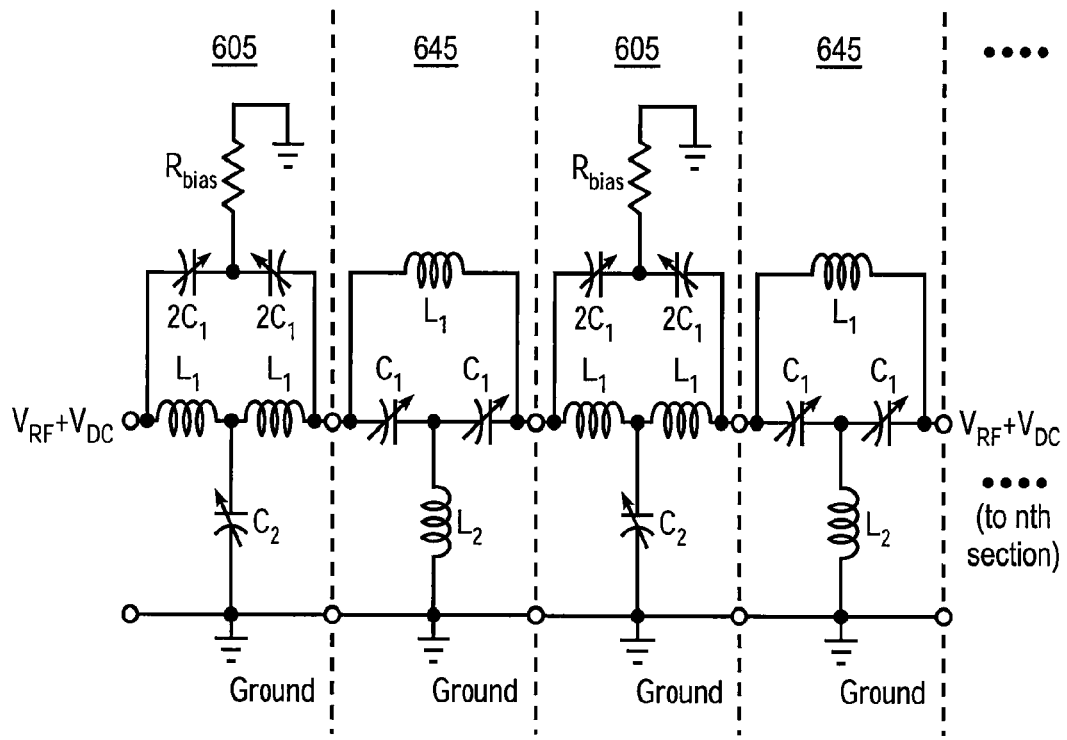
FIG. 7b illustrates one embodiment of a cascade of bridged low-pass and bridged high-pass with DC biasing circuit sections.

By way of example, in one embodiment for a 18 GHz to 22 GHz frequency range, one section made from a bridged low-pass with a center frequency of $f_1$, and a another section using a bridged high-pass with a center-frequency of $f_2$. The cascade would then involve an alternating sequence of both sections. The configuration can have as few as one of each section 605, 645 or multiples of each section in an alternated configurations. An example of such a configuration is shown in FIG. 7b with a modified bridge low-pass section 605 alternated with a modified bridge high-pass section 645. In sections 605 of FIG. 7b, the symbols labeled $2C_1$, $C_2$, $L_1$, $R_{bias}$ and Ground represent the same elements (varactors, inductors, bias resistance, ground) as in circuit 605 of FIG. 6a. In sections 645 of FIG. 7b, the symbols labeled $C_1$, $L_1$, $L_2$ and Ground represent the same elements (varactors, inductors, ground) as in circuit 645 of FIG. 6b. The notation "$V_{RF}+V_{DC}$ (to nth section)" indicates that additional sections can be cascaded with the sections shown in FIG. 7b.

Figure 8:
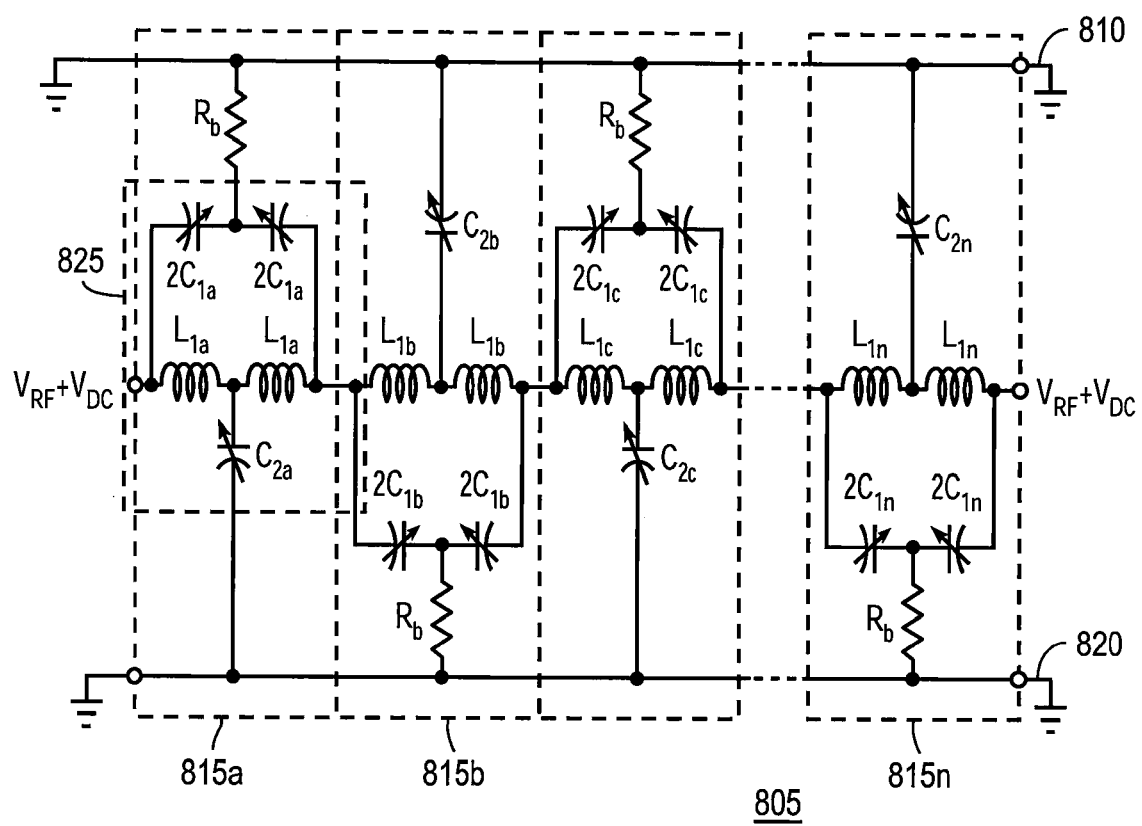
FIG. 8 illustrates one embodiment of a cascade of bridged low-pass circuit sections.

FIG. 8 illustrates an example embodiment of a cascade of bridged low-pass with DC biasing circuit in a dual ground configuration. In particular, for some monolithic implementations of an all-pass cascade topology using spiral inductors, the inductive elements may occupy a large area on the chip so that additional transmission-line sections may be inserted between adjacent elements. Although this may introduce series inductance between the sections leading to an undesired low-pass cutoff frequency in the structure, its effects can be reduced through multiple ground conductors that are electrically connected in off-chip packaging. This enables the all-pass sections to be clustered more closely together, which allows for smaller device sizes. An example using two ground rails on opposite sides of the chip is shown in FIG. 8.

In FIG. 8, each section 815ia-n is a bridged low pass with DC biasing circuit includes a modified bridge low-pass circuit 825 tied to a one ground rail 820 through varactor $C_{2a}$ and shunt bias portion tied to another ground rail 810 through a bias resistance $R_b$. The DC bias voltage signal (e.g., $V_{RF}+V_{DC}$)traverses the cascaded circuit along the modified bridged low pass circuit 825. The symbols labeled $2C_{1a}$, $L_{1a}$, $C_{2a}$, are capacitor and inductors, where the same labeling convention is used as in FIG. 7a. The letter subscript is changed to indicate different sections. Thus, $2C_{1b}$, $L_{1b}$, $C_{2b}$, in section 815b correspond to $2C_{1a}$, $L_{1a}$, $C_{2a}$ in section 815a. Generally speaking, for section 815n, the elements are labelled as $2C_{1n}$, $L_{1n}$, $C_{2n}$. Topologically, the cascaded configuration appears as one section flipped (e.g., upside down or toggled) relative to its adjacent section. As with the configurations illustrated in FIGS. 6a, 6b, and 7, when symmetry is sought with respect to application of the DC bias voltage signal to the circuit, the DC bias voltage signal can be applied simultaneously to both terminals rather than to one terminal or the other.

Figure 9:
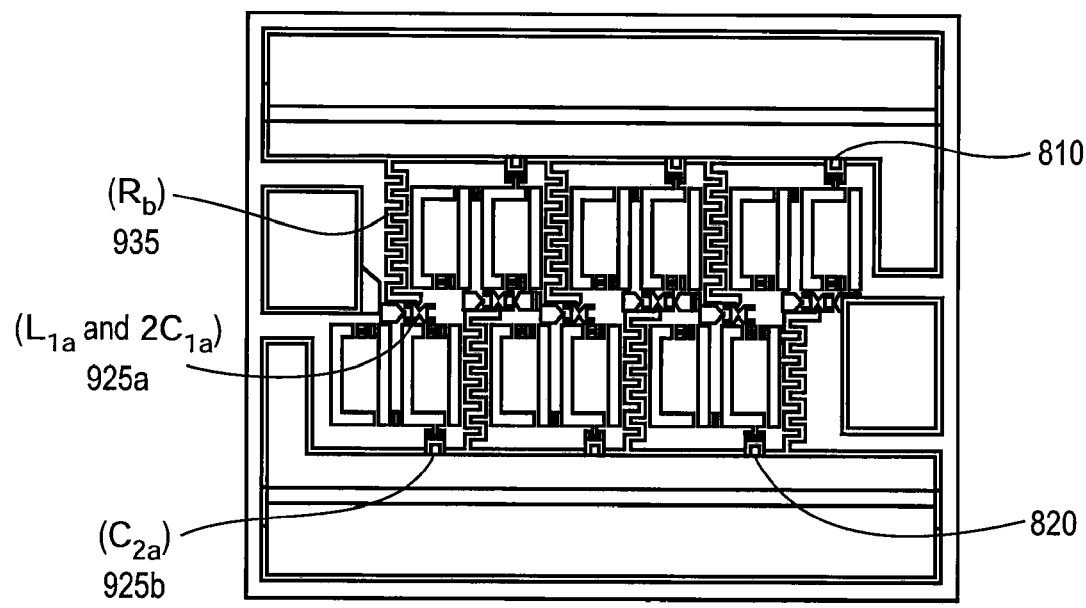
FIG. 9 illustrates one embodiment of an implementation (die photo) of a six-section all-pass phase shifter cascade, e.g., shown in FIG. 8, using spiral inductors, thin-film resistors, and dielectric varactors.

As noted, the cascaded circuit configuration (topology) illustrated in FIG. 8 beneficially allows for more compact circuit designs. For example, FIG. 9 illustrates one embodiment of an implementation (e.g., die photo showing physical layout) of a six-section all-pass phase shifter cascade, e.g., as shown in FIG. 8, using spiral inductors, thin-film resistors, and dielectric varactors. The configuration illustrated in FIG. 9 shows a relatively large layout footprint for a bias resistance $R_b$ 935, but, a relatively very small layout footprint for the modified bridge low pass circuit 825 of FIG. 8 which includes the $L_{1a}$ inductor element and $2C_{1a}$ capacitor elements 925a and the $C_{2a}$ capacitor element 925b). The elements labelled 810 and 820 in FIG. 9 are the ground rails 810 and 820 of FIG. 8. Further, the illustrated die shows compactness with respect to how all the components fit together with minimal "open space" on the die.

Figure 10:
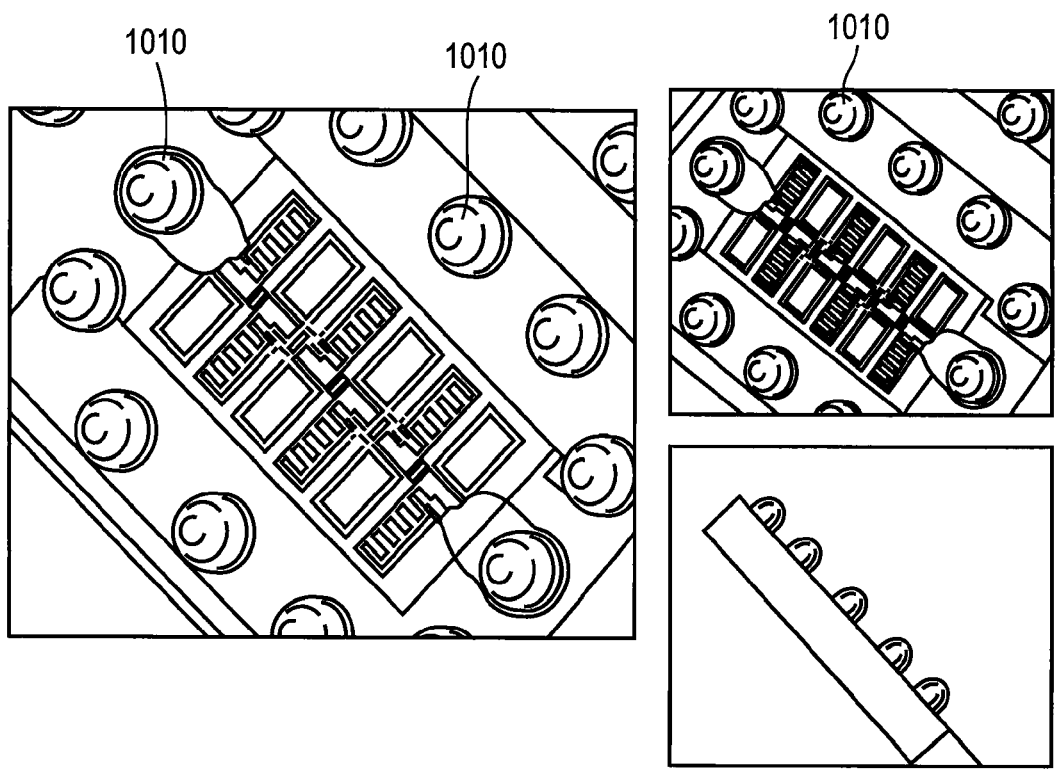
FIG. 10 illustrates one embodiment of an implementation (die photo) of solder bumps for flip-chip packaging.

FIG. 10 illustrates one embodiment of an implementation (die photo) of solder bumps 1010 for flip-chip packaging. The illustrated embodiment allows for small solder bump 1010 sizes, e.g., 100 micrometers.

The bridged low-pass with DC biasing circuit beneficially allows for more compact circuit designs and layouts. The bridged high pass with DC biasing circuit beneficially allows for simpler DC voltage biasing. Hence, the disclosed all pass circuits in a cascaded configuration also advantageously provides flexibility in circuit designs.

In general, it is noted that for the cascaded configurations, monolithic implementations are preferred for small-size and low-cost. For example, on-chip spiral inductors are a preferred method for implementing the inductive elements in each section. Multiple-layer spirals are preferred for minimizing the die area occupied by the inductors. Monolithic varactor technologies that can be easily integrated with spiral inductors are preferred. Some examples are dielectric varactors using BST materials or other voltage-variable dielectrics (strontium titanate (STO), barium titanate (BTO), barium strontium titanate (BST), bismuth zinc niobate (BZN), etc.), or semiconductor diodes using silicon (Si), gallium arsenide (GaAs), silicon germanium (SiGe), etc., or micro-electro-mechanical (MEMS) devices. Tunable capacitors can be made using BST-based technology, for example as described in U.S. patent application Ser. No. 10/822,563, "Fabrication of Parallel Plate Capacitors Using BST Thin Films," which is incorporated herein by reference.

By way of example, one embodiment of a phase shifter in accordance with the principles disclosed herein is a 42 GHz phase shifter using thin-film BST on sapphire technology. The phase shifter can be configured for use in a 40 GHz to 44 GHz range with a 360 degree minimum phase shift using a control voltage range from 0 V to 20 V. In such configurations, the maximum insertion loss is 10 dB and a return loss is greater than or equal to 6 dB. Hence, such a configuration would provide continuous and precise analog control with a highly uniform group delay, good power handing (e.g., greater than +20 dBm), all within a compact die size (e.g., 1.0 mm×0.85 mm size). Moreover, configurations such as this example would have virtually no control-circuit power consumption due to its single control line configuration as previously described.

Upon reading this disclosure, those of skill in the art will appreciate still additional alternative structural and functional designs for a system and a process for an analog phase shifter using voltage tunable capacitor (varactor) through the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A phase shifter comprising:
a plurality of all-pass sections, each all-pass section including a first tunable capacitor and having a center-frequency different from another all-pass section, each center frequency selected to provide a composite response corresponding to a substantially constant phase response over a predetermined frequency range, wherein the first tunable capacitor of an all pass section of the plurality of all-pass sections comprises a semiconductor diode varactor and the semiconductor diode varactor comprises a material from a group consisting of silicon, gallium arsenide, and silicon germanium.

2. A phase shifter comprising:
a plurality of all-pass sections, each all-pass section including a first tunable capacitor and having a center-frequency different from another all-pass section, each center frequency selected to provide a composite response corresponding to a substantially constant phase response over a predetermined frequency range, wherein the first tunable capacitor of an all pass section of the plurality of all-pass sections comprises a micro-electro-mechanical (MEMS) device.

3. A phase shifter comprising:
a plurality of all-pass sections cascaded in series, each all-pass section including a first tunable capacitor and having a center-frequency different from another all-pass section, each center frequency selected to provide a composite response corresponding to a substantially constant phase response over a predetermined frequency range, wherein each all-pass section further comprises:
an input and an output, the first tunable capacitor connected between the input and the output;
a plurality of series-connected inductors connected between the input and output; and
a second tunable capacitor connected between a junction of the plurality of series-connected inductors and a ground.

4. The phase shifter of claim 3, wherein each of the first tunable capacitor and the second tunable capacitor of an all-pass section comprises a dielectric varactor disposed upon a substrate.

5. The phase shifter of claim 4, where each of the dielectric varactors comprises a dielectric selected from a group consisting of strontium titanate (STO), barium titanate (BTO), and barium strontium titanate (BST).

6. The phase shifter of claim 5, wherein the predetermined frequency range is an RF frequency range.

7. The phase shifter of claim 5, wherein a center frequency for at least one of the all-pass sections falls outside the predetermined frequency range.

8. The phase shifter of claim 5, wherein at least two of the all-pass sections have a same center frequency and said at least two all-pass sections are separated from each other by other all-pass section(s) with different center frequencies.

9. The phase shifter of claim 5, wherein the plurality of series-connected inductors is also disposed upon the substrate.

10. The phase shifter of claim 5, wherein the phase shifter is capable of phase shifts of 360 degrees or more.

11. The phase shifter of claim 10, wherein the phase shifter is capable of a phase shift of 360 degrees at a bias voltage for the tunable capacitors of 20 volts or less.

12. The phase shifter of claim 4, wherein the phase shifter is capable of phase shifts of 360 degrees or more.

13. The phase-shifter of claim 3, wherein the ground comprises a plurality of ground conductors.

14. The phase-shifter of claim 13, wherein the plurality of ground conductors is configured for electrical coupling during packaging of the phase shifter.

15. The phase-shifter of claim 3, farther comprising direct current (DC) blocking capacitors at the input and output of the phase-shifter.

16. The phase-shifter of claim 15, further comprising a bias voltage source configured to apply a bias voltage to all of the first and second tunable capacitors in the circuit.

17. The phase-shifter of claim 15, farther comprising a resistor coupled with a DC control voltage to one of the input, the output, and a signal path between the input and the output of at least one all-pass section.

18. The phase-shifter of claim 3, where an inductor is included in series with the second tunable capacitor.

19. The phase-shifter of claim 3, wherein the series inductors comprise a spiral inductor disposed upon a chip.

20. The phase-shifter of claim 3, wherein the series inductors comprise a distributed element.

21. The phase-shifter of claim 20, wherein the distributed element comprises a transmission-line segment.

22. The phase-shifter of claim 3, wherein the ground comprises a common ground conductor.

23. The phase-shifter of claim 3, wherein the first tunable capacitor between the input and output of each all-pass section comprises:
a plurality of series-connected tunable capacitors; and
a biasing resistor connected between a junction of the series-connected tunable capacitors and the ground.

24. A phase shifter comprising:
a low-pass bridged section, including a tunable capacitor and having a first center-frequency;
a high-pass bridged section, including a tunable capacitor and having a second center frequency, the high-pass bridged section coupled with the low-pass bridged section, the first and the second center frequencies selected to provide composite response corresponding to a substantially constant phase response over a predetermined frequency range.

25. The phase shifter of claim 24, wherein the tunable capacitor in the low-pass bridged section and the tunable capacitor in the high-pass bridged section each comprises a dielectric varactor disposed upon a substrate.

26. The phase shifter of claim 25, where each of the dielectric varactors comprises a dielectric selected from a group consisting of strontium titanate (STO), barium titanate (BTO), and barium strontium titanate (BST).

27. The phase shifter of claim 26, wherein at least two of the all-pass sections have a same center frequency and said at least two all-pass sections are separated from each other by other all-pass section(s) with different center frequencies.

28. The phase shifter of claim 26, wherein a center frequency for at least one of the all-pass sections falls outside the predetermined frequency range.

29. The phase shifter of claim 26, wherein the predetermined frequency range is an RF frequency range.

30. The phase shifter of claim 26, wherein the phase shifter is capable of phase shifts of 360 degrees or more.

31. The phase shifter of claim 30, wherein the phase shifter is capable of a phase shift of 360 degrees at a bias voltage for the tunable capacitors of 20 volts or less.

32. The phase shifter of claim 25, wherein the phase shifter is capable of phase shifts of 360 degrees or more.

33. The phase shifter of claim 24, wherein the tunable capacitor of the bridged low-pass section and the tunable capacitor of the bridged high-pass section each comprises a micro-electro-mechanical (MEMS) device.

34. The phase shifter of claim 24, wherein the tunable capacitor of the bridged low-pass section and the tunable capacitor of the bridged high-pass section each comprises a semiconductor diode varactor.

35. The phase shifter of claim 34, wherein each semiconductor diode varactor comprises a material from a group consisting of silicon, gallium arsenide, and silicon germanium.

36. The phase shifter of claim 24, wherein the tunable capacitor of the bridged low-pass section and the tunable capacitor of the bridged high-pass section each comprises a tunable dielectric.

37. The phase shifter of claim 36, wherein each of the tunable dielectric comprises one from a group consisting of strontium titanate (STO), barium titanate (BTO), barium strontium titanate (BST), and bismuth zinc niobate (BZN).

38. The phase shifter of claim 24, wherein the high-pass bridged section couples with a second low-pass bridged section including a tunable capacitor and having a third center frequency, the third center frequency selected to provide a composite response corresponding to a substantially constant phase response over a predetermined frequency range.

39. The phase shifter of claim 38, wherein the second low-pass bridged section couples with a second high-pass bridged section including a tunable capacitor and having a fourth center frequency, the fourth center frequency selected to provide a composite response corresponding to a substantially constant phase response over a predetermined frequency range.

40. A phase shifter comprising:
a plurality of all-pass sections cascaded in series, each all-pass section including a first tunable capacitor and having a center-frequency different from another all-pass section, each center frequency selected to provide a composite response corresponding to a substantially constant phase response over a predetermined frequency range, wherein each all-pass section further comprises:
an input and an output, the first tunable capacitor comprising a plurality of tunable capacitors connected in series between the input and output;
a first inductor connected between the input and the output; and
a second inductor connected between a ground and a junction of two tunable capacitors of the plurality of tunable capacitors connected in series.

41. The phase-shifter of claim 40, wherein the series inductors comprise a distributed element.

42. The phase-shifter of claim 41, wherein the distributed element comprises a transmission-line segment.

43. The phase-shifter of claim 40, wherein the ground comprises a common ground conductor.

44. The phase-shifter of claim 40, wherein the ground comprises a plurality of ground conductors.

45. The phase-shifter of claim 44, wherein the plurality of ground conductors is configured for electrical coupling during packaging of the phase shifter.

46. The phase-shifter of claim 40, wherein the series inductors cokprise a spiral inductor disposed upon a chip.

47. The phase shifter of claim 40, wherein each of the plurality of tunable capacitors of an all-pass section comprises a dielectric varactor disposed upon a substrate.

48. The phase-shifter of claim 47, wherein the phase shifter is capable of phase shifts of 360 degrees or more.

49. The phase shifter of claim 47, where each of the dielectric varactors comprises a dielectric selected from a group consisting of strontium titanate (STO), barium titanate (BTO), and barium strontium titanate (BST).

50. The phase shifter of claim 49, wherein the phase shifter is capable of phase shifts of 360 degrees or more.

51. The phase shifter of claim 50, wherein the phase shifter is capable of a phase shift of 360 degrees at a bias voltage for the tunable capacitors of 20 volts or less.

52. The phase shifter of claim 49, wherein the predetermined frequency range is an RF frequency range.

53. The phase shifter of claim 49, wherein a center frequency for at least one of the all-pass sections falls outside the predetermined frequency range.

54. The phase shifter of claim 49, wherein at least two of the all-pass sections have a same center frequency and said at least two all-pass sections are separated from each other by other all-pass section(s) with different center frequencies.

55. The phase shifter of claim 49, wherein the first inductor and the second inductor are also disposed upon the substrate.

56. the phase-shifter of claim 40, further comprising direct current (DC) blocking capacitors at the input and output of the phase-shifter.

57. The phase-shifter of claim 56, further comprising a resistor coupled with a DC control voltage to one of the input, the output, and a signal path between the input and the output of at least one all-pass section.

58. The phase-shifter of claim 40, further comprising a third inductor connected in series with the first inductor between the input and the output of each all-pass section.

* * * * *

UNITED STATES PATENT AND TRADEMARK OFFICE
CERTIFICATE OF CORRECTION

PATENT NO.         : 7,276,993 B2                                          Page 1 of 1
APPLICATION NO. : 11/288723
DATED              : October 2, 2007
INVENTOR(S)        : Robert A. York It is certified that error appears in the above-identified patent and that said Letters Patent is hereby corrected as shown below:

Column 10,
Line 54, please replace "farther" with -- further --.

Column 10,
Line 60, please replace "farther" with -- further --.

Column 12,
Line 44, please replace "cokprise" with -- comprise --.

Signed and Sealed this

Eighteenth Day of March, 2008

JON W. DUDAS
*Director of the United States Patent and Trademark Office*